United States Patent
Ting et al.

(10) Patent No.: US 9,502,287 B2
(45) Date of Patent: Nov. 22, 2016

(54) METHOD OF PREVENTING PATTERN COLLAPSE

(71) Applicant: Taiwan Semiconductor Manufacturing Company, Ltd., Hsin-Chu (TW)

(72) Inventors: Chih-Yuan Ting, Taipei (TW); Chung-Wen Wu, Zhubei (TW); (Continued)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

(21) Appl. No.: 14/873,301

(22) Filed: Oct. 2, 2015

(65) Prior Publication Data

US 2016/0027688 A1 Jan. 28, 2016

Related U.S. Application Data

(62) Division of application No. 13/911,604, filed on Jun. 6, 2013, now Pat. No. 9,153,479.
(Continued)

(51) Int. Cl.
*H01L 21/764* (2006.01)
*H01L 21/768* (2006.01)
(Continued)

(52) U.S. Cl.
CPC ... *H01L 21/76846* (2013.01); *H01L 21/32139* (2013.01); *H01L 21/764* (2013.01);
(Continued)

(58) Field of Classification Search
CPC ............ H01L 21/764; H01L 21/76804; H01L 21/7682; H01L 21/76877; H01L
(Continued)

(56) References Cited

U.S. PATENT DOCUMENTS 6,080,625 A     6/2000  Chittipeddi et al.
7,180,190 B2 *  2/2007  Lee ................. H01L 23/5283
                                                  257/296
(Continued)

FOREIGN PATENT DOCUMENTS

JP   UPAP 2000-124326    4/2000
JP   UPAP 2012-256806   12/2012
(Continued)

OTHER PUBLICATIONS

Office Action issued Jul. 8, 2015 in Chinese Patent Application No. 103107362 filed Dec. 28, 2012.
(Continued)

*Primary Examiner* — Phat X Cao
(74) *Attorney, Agent, or Firm* — Haynes and Boone, LLP

(57) ABSTRACT

A device includes a substrate and at least three conducting features embedded into the substrate. Each conducting feature includes a top width x and a bottom width y, such that a top and bottom width (x1, y1) of a first conducting feature has a dimension of (x1<y1), a top and bottom width (x2, y2) of a second conducting feature has a dimension of (x2<y2; x2=y2; or x2>y2), and a top and bottom width (x3, y3) of a third conducting feature has a dimension of (x3>y3). The device also includes a gap structure isolating the first and second conducting features. The gap structure can include such things as air or dielectric.

20 Claims, 12 Drawing Sheets

(72) Inventors: Jeng-Shiou Chen, Kaohsiung (TW);
Jang-Shiang Tsai, Zhubei (TW);
Jyu-Horng Shieh, Hsin-Chu (TW)

Related U.S. Application Data

(60) Provisional application No. 61/776,651, filed on Mar. 11, 2013.

(51) Int. Cl.
*H01L 23/522* (2006.01)
*H01L 23/485* (2006.01)
*H01L 21/3213* (2006.01)
*H01L 23/528* (2006.01)

(52) U.S. Cl.
CPC ..... *H01L 21/7682* (2013.01); *H01L 21/76802* (2013.01); *H01L 21/76804* (2013.01); *H01L 21/76831* (2013.01); *H01L 21/76834* (2013.01); *H01L 21/76837* (2013.01); *H01L 21/76852* (2013.01); *H01L 21/76877* (2013.01); *H01L 21/76883* (2013.01); *H01L 21/76885* (2013.01); *H01L 23/485* (2013.01); *H01L 23/5222* (2013.01); *H01L 23/5226* (2013.01); *H01L 23/5283* (2013.01); *H01L 2924/0002* (2013.01)

(58) Field of Classification Search
CPC .......................... 21/76885;H01L 23/485; H01L 23/5222
See application file for complete search history.

(56) References Cited

U.S. PATENT DOCUMENTS

| | | | |
|---|---|---|---|
| 7,348,671 B2 * | 3/2008 | Kirby | ................ H01L 21/76898 257/753 |
| 2004/0232555 A1 | 11/2004 | Komatsubara | |
| 2006/0166498 A1 | 7/2006 | Kirby | |
| 2008/0217730 A1 | 9/2008 | Furukawa et al. | |
| 2011/0210448 A1 | 9/2011 | Nitta et al. | |
| 2012/0168953 A1 | 7/2012 | Edelstein et al. | |
| 2013/0093092 A1 | 4/2013 | Kanki et al. | |
| 2014/0191401 A1 * | 7/2014 | Fischer | ............... H01L 21/7685 257/751 |
| 2014/0252625 A1 | 9/2014 | Ting et al. | |

FOREIGN PATENT DOCUMENTS

| | | |
|---|---|---|
| KR | 1020090130678 | 12/2009 |
| KR | 1020100127673 | 6/2010 |

OTHER PUBLICATIONS

Korean Notice of Allowance issued Jul. 20, 2015 in Application No. 10-2013-0129035.
Korean Office Action issued Jan. 22, 2015, Patent Application No. 10-2013-0129035 filed May 19, 2012.

\* cited by examiner

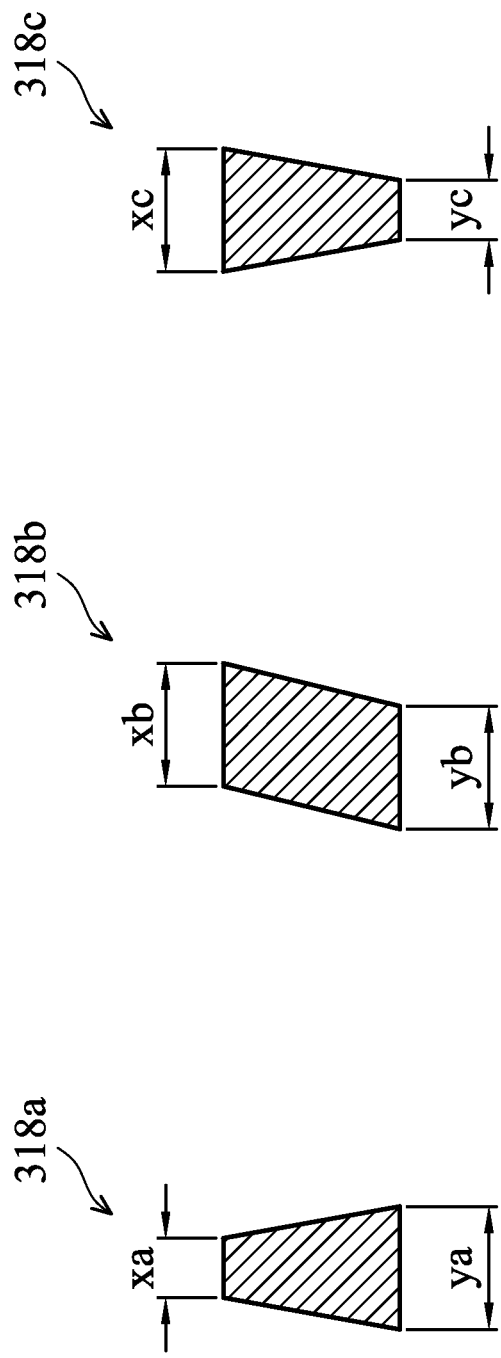

METHOD OF PREVENTING PATTERN COLLAPSE

PRIORITY DATA

The present application is a divisional application of U.S. application Ser. No. 13/911,604, filed on Jun. 6, 2013, which claims priority to U.S. Application No. 61/776,651, filed on Mar. 11, 2013, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of a feature is scaled down, the feature may have a high aspect ratio (the ratio of the height vs. width of the feature). When the high aspect ratio reaches a critical value, the feature may actually collapse or fall down during the fabrication process. Accordingly, what is needed is a method for preventing this from happening.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 11A-11C are cross sectional views of structures according to one or more embodiments.

DETAILED DESCRIPTION

Figure 1:
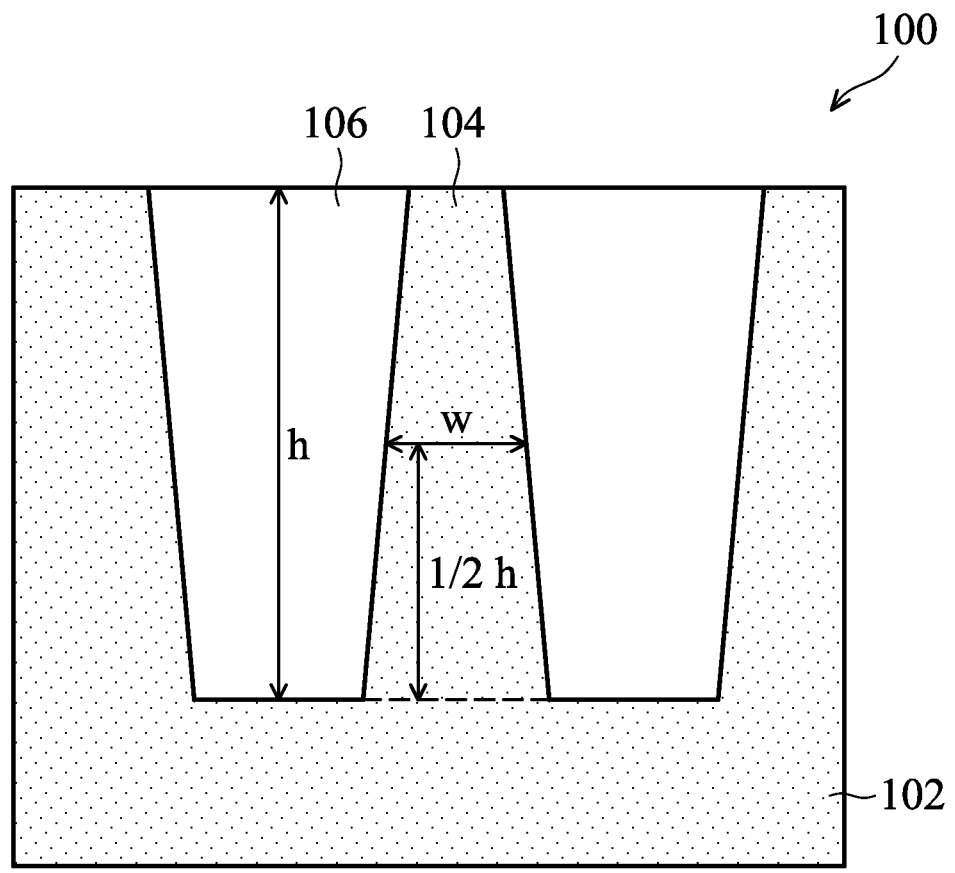
FIG. 1 is a cross sectional view of a device according to one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a structure 100 is part of a device fabricated according to one or more embodiments of the present disclosure. The structure 100 includes a substrate 102, a substrate pattern 104 formed on the substrate, and a trench 106 embedded into the substrate. In one embodiment, the trench 106 may be filled with different insulator and/or dielectric material, such as silicon oxide, silicon nitride, or silicon oxynitride, to form an isolation structure in the substrate 102. In another embodiment, the trench 106 is filled with a conducting material, such as Al, Cu, Ni, W, or combination thereof, to form a connection line (e.g. trench metal line) or a connection plug (e.g. via metal) in the substrate 102. If the substrate pattern 104 collapses during the fabrication, filing the trench 106 may not be performed.

The pattern 104 includes a pattern height h and a pattern width w. For a pattern with irregular or non-rectangular sides, such as shown in FIG. 1, the pattern width w can be defined at a midpoint (or average) of the pattern, such as at ½ of the height. A ratio of h/w defines an aspect ratio of the pattern. The higher the aspect ratio, the more prone the pattern is to collapse or fall. A critical aspect ratio of a pattern is an aspect ratio of the pattern at which the pattern begins to collapse or fall. In other words, when an aspect ratio of a pattern is equal to or larger than its critical aspect ratio of the pattern, the pattern is likely to collapse or fall down. The critical aspect ratio of a pattern depends on various factors, one of which being the material composing the pattern. In one embodiment, a pattern composed of a relatively soft material, such as an extreme low-k dielectric material, will have a relatively low critical aspect ratio, as compared to a pattern composed of a relatively hard material, such as metal.

Figure 2:
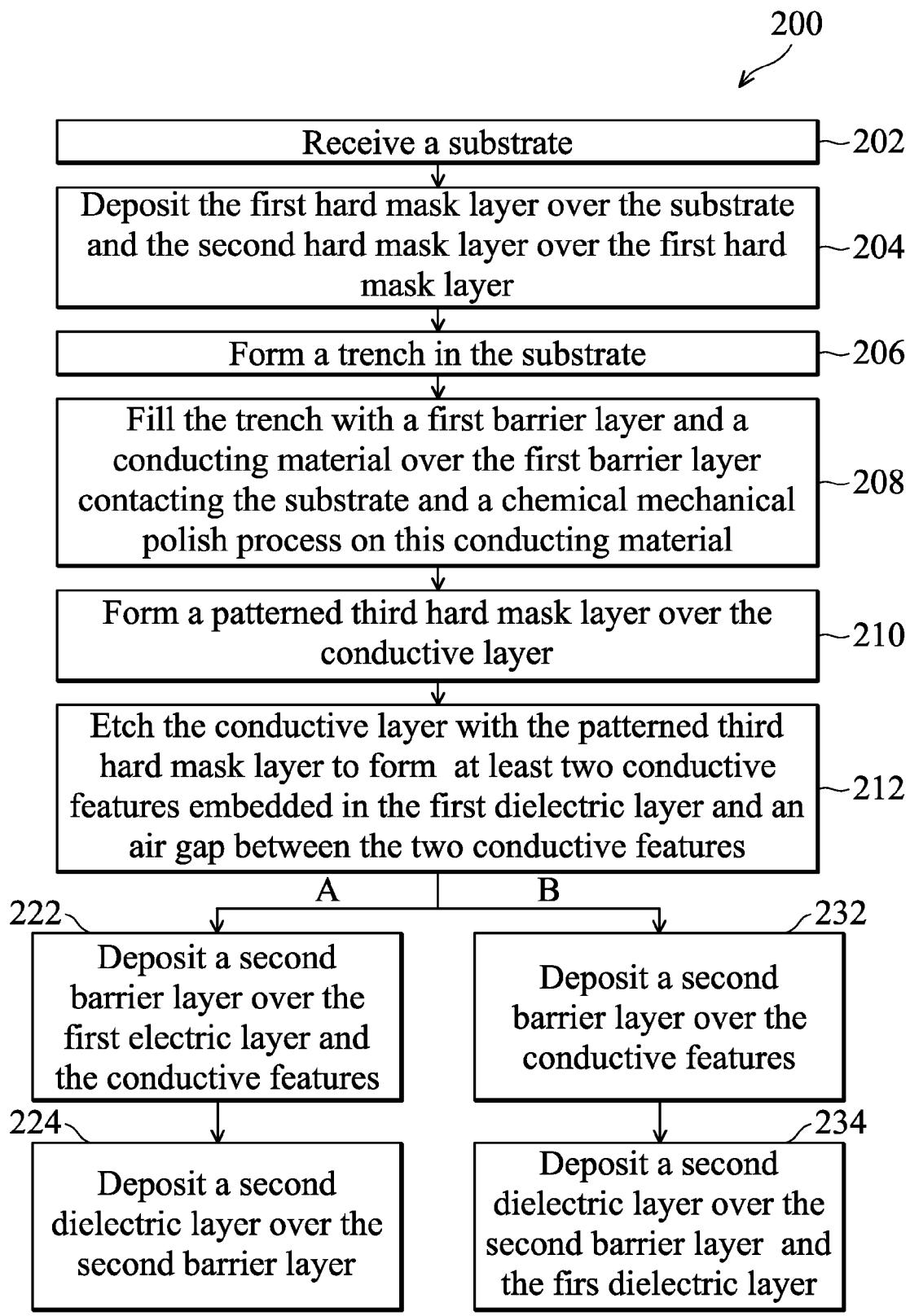
FIG. 2 is a flow chart of a method of fabricating a device for implementing one or more embodiments.

Referring now to FIG. 2, a flow chart of a method 200 for fabricating a device is illustrated according to one or more embodiments of the present disclosure. It is understood that additional steps can be provided before, during, and after the method 200, and some steps described can be replaced, eliminated, or moved around for additional embodiments of the method 300. The method 200 will be further described below, and more specific embodiments of fabricating a device 300 using the method 200 will concurrently be described with reference to FIGS. 3-11.

Figure 3:
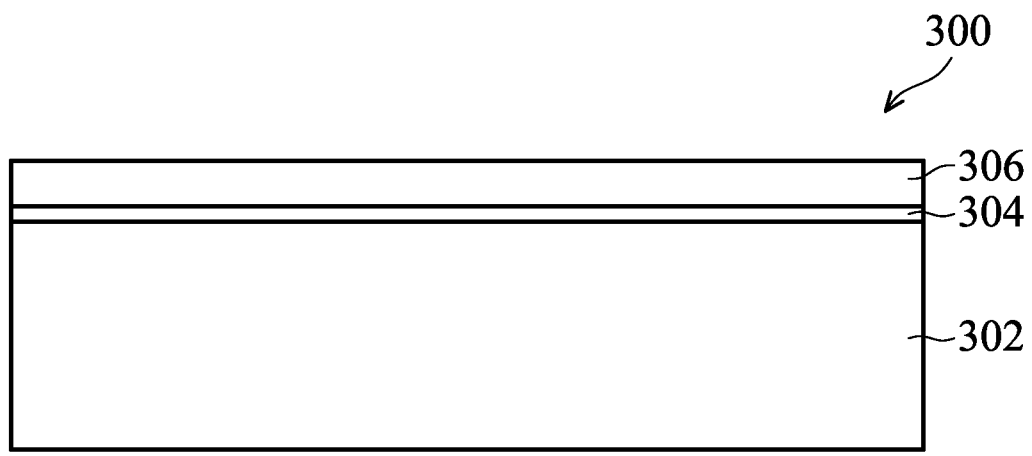
FIGS. 3-8, 9A-9C, and 10A-10C are cross sectional views of forming a device for implementing one or more embodiments.

The method 200 begins at step 202 by receiving or providing a substrate. In the present embodiments, a substrate is also referred to as a wafer substrate. Referring to FIG. 3, a substrate 302 is provided. In the present embodiment, the substrate 302 includes a silicon wafer. Alternatively or additionally, the substrate 302 may include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the substrate 302 may also include a dielectric layer, a conducting layer, or combination thereof.

The method 200 proceeds to step 204 by depositing a first hard mask layer over the substrate, and depositing a second hard mask layer over the first hard mask layer. Referring again to FIG. 3, a first hard mask layer 304 is deposited on the substrate 302, and a second hard mask layer 306 is deposited on the first hard mask layer 304. In one or more embodiments, the first hard mask layer 304 may include a dielectric material, such as silicon oxide, silicon nitride, silicon oxynitride, or other suitable materials. In some embodiments, the second hard mask layer 306 includes a metal nitride compound, such as TiN. The first hard mask layer 304 and/or the second hard mask layer 306 may be deposited using a chemical vapor deposition (CVD) or a physical vapor deposition (PVD) process.

Figure 4:
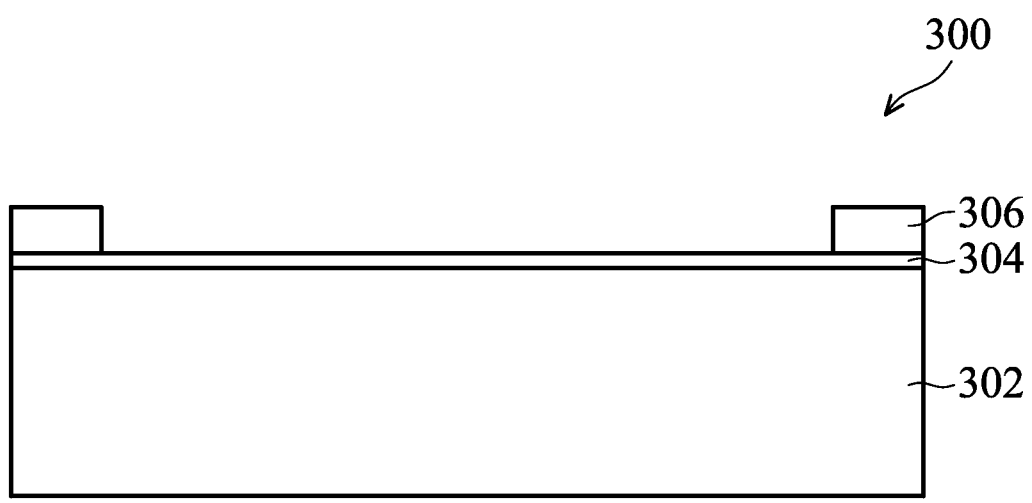
Figure 5:
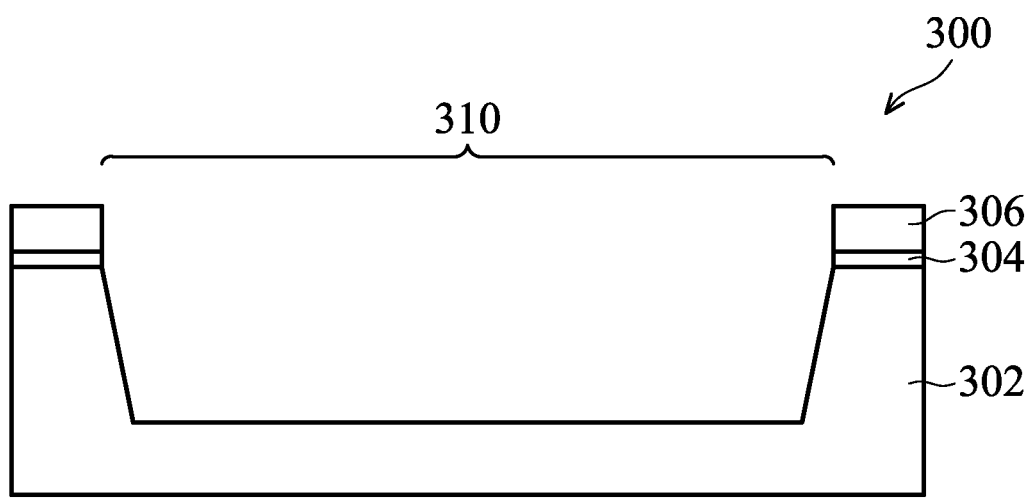

The method 200 proceeds to step 206 by forming a trench embedded into the substrate. The trench can be formed using multiple steps, such as shown and discussed below with reference to FIGS. 4 and 5. Referring to FIG. 4, a resist pattern is formed on the second hard mask layer 306, which is then etched to form the patterned second hard mask layer 306. Referring to FIG. 5, the patterned second hard mask layer 306 is then used to etch the trench 310 embedded in the substrate 320.

Figure 6:
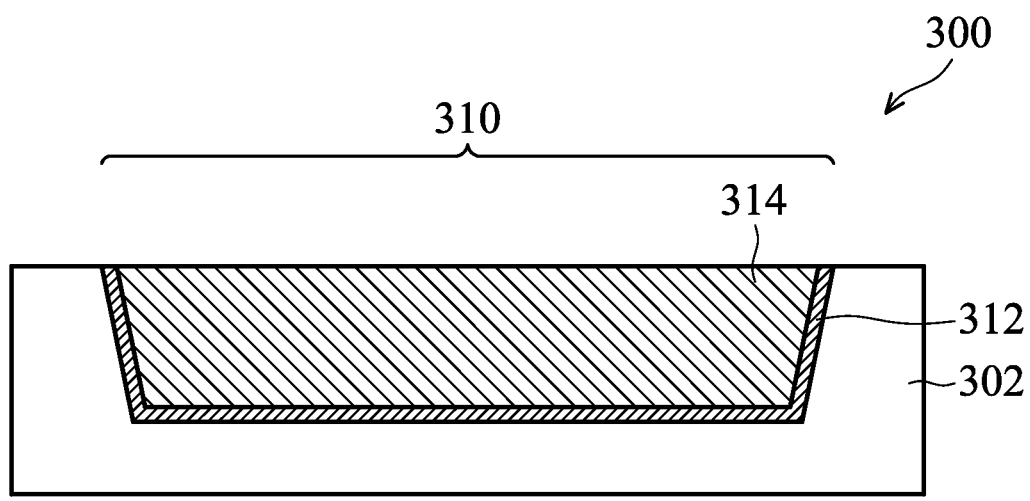

The method 200 proceeds to step 208 by forming a first barrier layer in the trench, next to the substrate, and filling the trench with a conducting layer. Referring to FIG. 6, a first barrier layer 312 is disposed over the sidewalls and bottom of the trench 310 embedded into the substrate 302, and a conducting layer 314 is disposed over the first barrier layer 312 to fill the trench. The first barrier layer 312 prevents conducting material from the conducting layer 314, such as a metal, from migrating into the substrate 302. In the present embodiments, a first barrier layer is also considered as a portion of the conducting layer. In one or more embodiments, the first barrier layer 312 includes a metal and/or a metal compound, such as TaN/Ta with a thickness ranging from approximate 20 to 500 Å. In some embodiments, the conducting layer 314 includes a metal or a metal alloy, such as Al, Cu, W, Al alloy, Cu alloy, or W alloy. One way of filling the trench includes using a deposition process, such as CVD, PVD, sputtering, or an electroplating process. In the present embodiment, filling the trench further includes using a chemical mechanical polishing (CMP) process and a cleaning process. As shown in FIG. 6, the first hard mask layer 304 and the second hard mask layer 306 are also removed.

Figure 7:
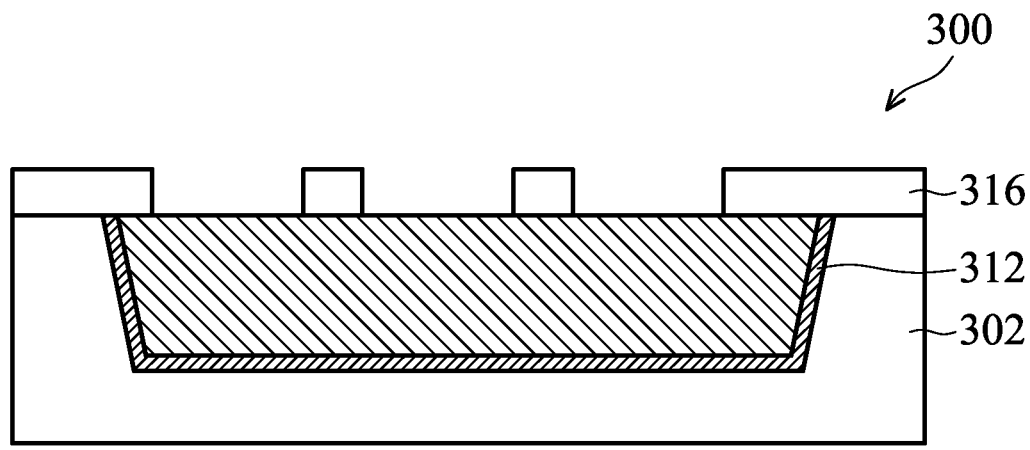

The method 200 proceeds to step 210 by forming a patterned third hard mask layer disposed over the conducting layer embedded into the substrate. Referring to FIG. 7, a patterned mask layer 316 is formed over the conducting layer 314 and the substrate 302. In some embodiments, the patterned mask layer 316 includes an organic material, such as a photo resist. In some embodiments, the patterned mask layer 316 includes a dielectric material, such as silicon oxide, silicon nitride, or silicon oxynitride. One way of forming the patterned third mask layer 316 includes using a deposition process, such as, a CVD or PVD process, a lithography process, an etching process, and/or a cleaning process.

Figure 8:
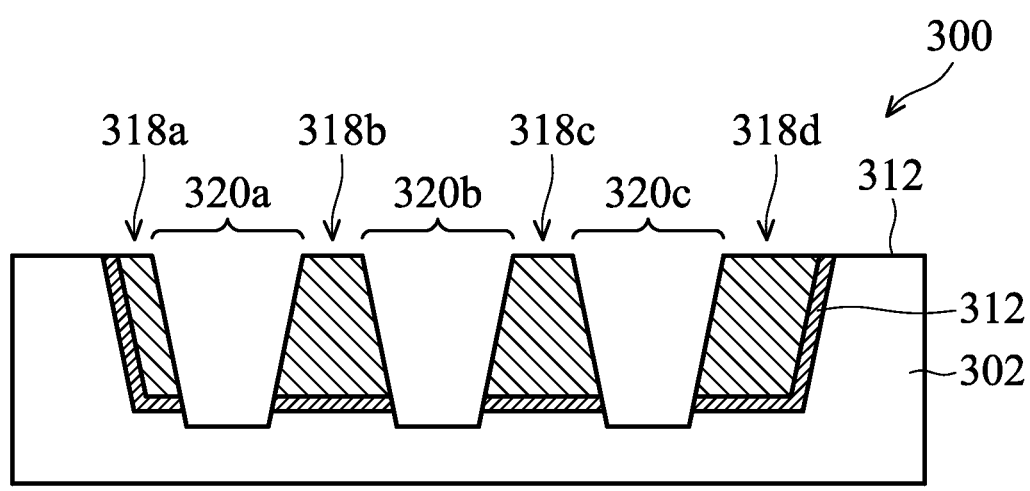

The method 200 proceeds to step 212 by etching the conducting layer and the first barrier layer by using the patterned third hard mask layer to form the patterned conducting layer. Referring to FIG. 8, conducting features 318a-d are formed on the first barrier layer 312 and air gap structures 320a-c are formed between the conducting features 318a-d respectively. It is noted that in the present embodiment, the air gap structures 320a-c also extend below the first barrier 312 to form recesses, as shown in FIG. 8. In one embodiment, the conducting features 318a-d includes Cu. Because the Cu has a strong mechanical strength, the corresponding pattern or feature will have a relatively large critical aspect ratio. Therefore, the conducting features 318a-d may be further scaled down to a dimension as low as 10 nm without the pattern or feature becoming likely to collapse. In this embodiment, by filling up the air gap structures 320a-c with a dielectric material, such as a low-k dielectric material, a conducting line or a wire line with a small dimension, such as 10 nm, is embedded into the low-k dielectric material without a pattern or feature collapse issue involved with the low-k dielectric material pattern as mentioned in FIG. 1. One way of forming the conducting features includes using an etching process, a CMP process, and a cleaning process.

Figure 9A:
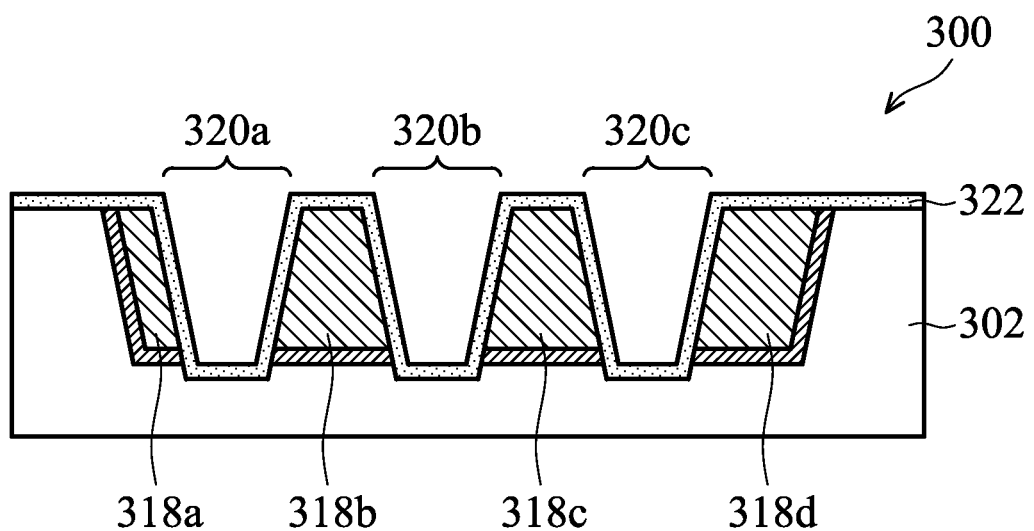

FIG. 2 shows two alternative processes to be performed after step 212. In the first alternative embodiment, the method 200 proceeds to step 222 along a path A by depositing a second barrier over the substrate and the conducting features embedded into the substrate. Referring to FIG. 9A, a second barrier layer 322 is formed over the conducting features 318a-d and the substrate 302. The second barrier layer 322 covers all open surfaces, such as sidewall and top surfaces of the conducting features 318a-d and open surfaces of the substrate 302. In one embodiment, the second barrier layer 322 includes silicon carbon (SiC), silicon nitride (SiN), silicon carbon nitride (SiCN), or silicon oxide ($SiO_2$). In the present embodiment, the thickness of the second barrier layer 322 ranges from approximate 20 to 100 Å. One way of depositing the second barrier layer 322 is using an atomic layer deposition (ALD) process.

Figure 9B:
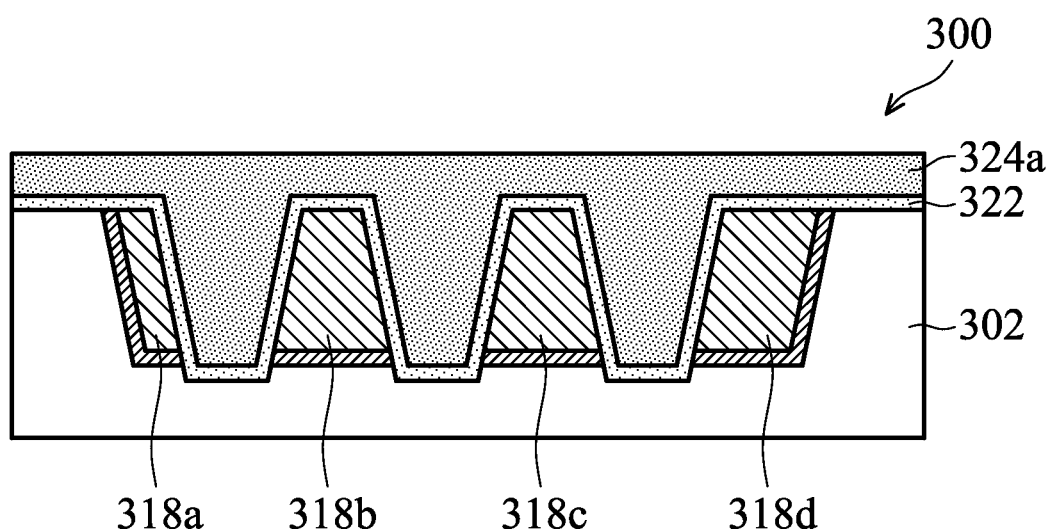
Figure 9C:
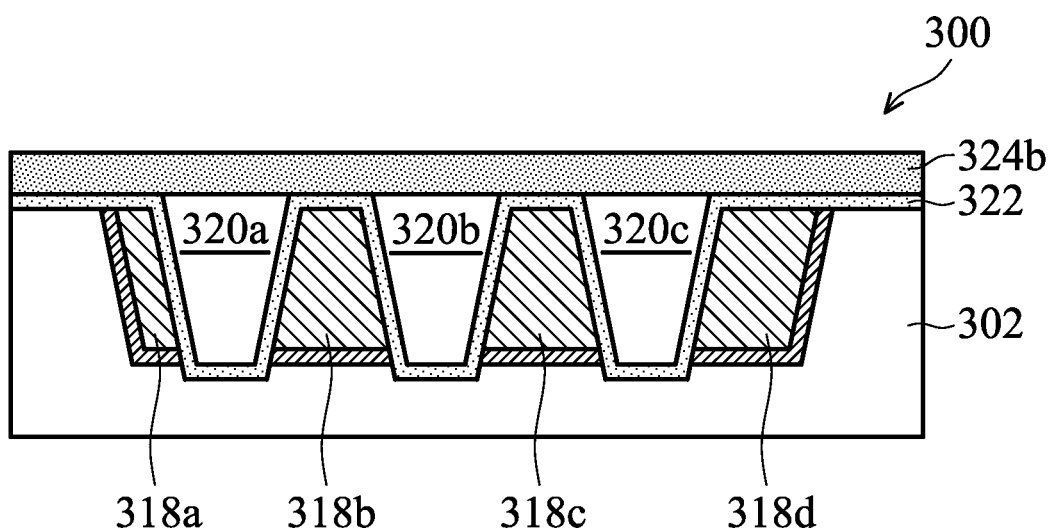

Continuing with the process in path A, the method 200 proceeds to step 224 by forming a second dielectric layer on the second barrier layer disposed over the conducting features embedded into the substrate. In one embodiment, as shown in FIG. 9B, forming a second dielectric layer 324a includes filling the air gap structures 320a-c between the conducting features 318a-d respectively. In another embodiment, as shown in FIG. 9C, forming a second dielectric layer 324b includes keeping the air gap structures 320a-c. That is, the second dielectric layer 324b does not fill the underlying air gap structures. In some embodiments, the second dielectric layers 324a and 324b include a dielectric material, such as silicon oxide ($SiO_2$), silicon nitride (SiN), or silicon oxynitride (SiON). In additional embodiments, the second dielectric layers 324a and 324b may include a low-k dielectric material, such as fluorine-doped silicon oxide, carbon-doped silicon oxide, porous silicon oxide, porous carbon-doped silicon oxide, organic polymers, or silicone based polymers. The second dielectric layer 324a and/or 324b may be formed using a CVD or a PVD process.

Figure 10A:
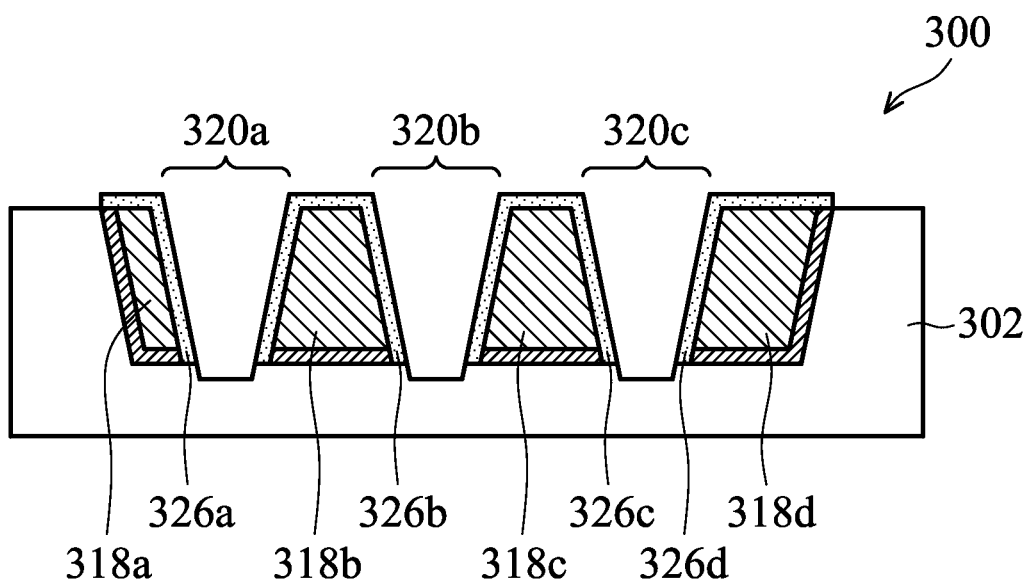

Referring again to FIG. 2, in another process, the method 200 proceeds from step 212 to step 232 along a path B by depositing a second barrier layer over the conducting features. Referring to FIG. 10A, second barrier layers 326a-d are formed over the conducting features 318a-d respectively. In the present embodiments, the second barrier layers 326a-d only cover sidewall and top of the conducting features 318a-d. In the present embodiment, the second barrier layers 326a-d include a metal, such as cobalt (Co), with a thickness ranging from approximate 10 to 50 Å. The second barrier layers 326a-d can be formed using a CVD or PVD process.

Figure 10B:
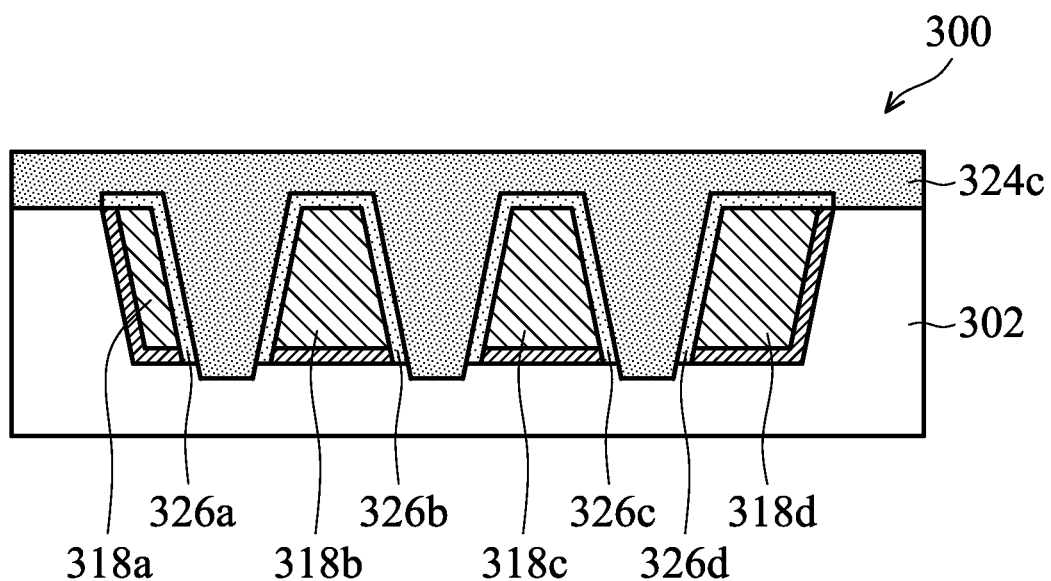
Figure 10C:
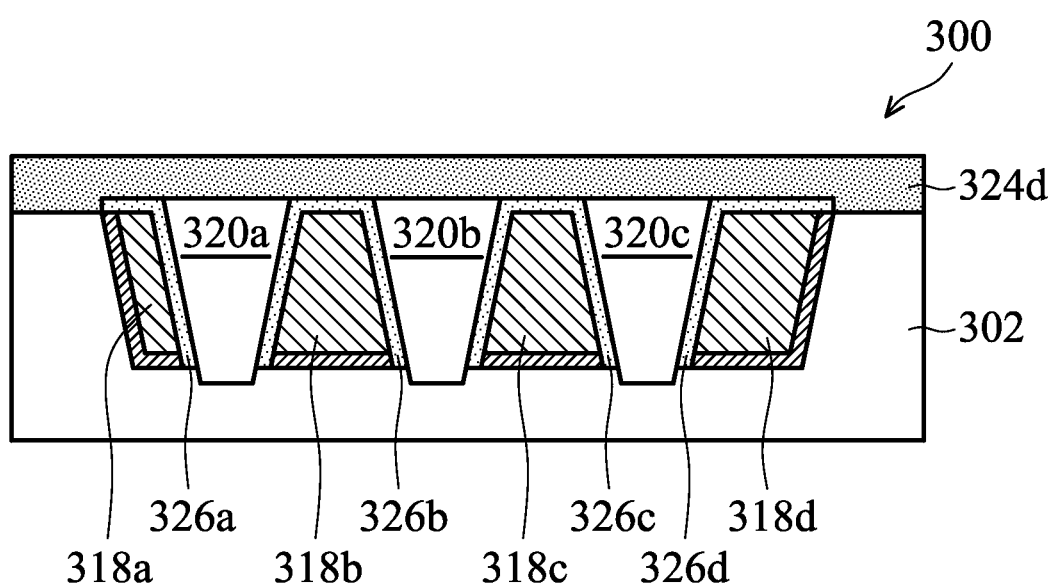

Continuing with the process in path B, the method 200 proceeds to step 234 by forming a second dielectric layer over the second barrier layer disposed on the conducting features embedded into the substrate. In one embodiment as shown in FIG. 10B, forming a second dielectric layer 324c includes filling the air gap structures 320a-c between the conducting features 318a-d. In another embodiment as shown in FIG. 10C, depositing a second dielectric layer 324d includes keeping the air gap structures 320a-c buried under the second dielectric layer 324d without filling up the air gap structures 320a-c. In an alternative embodiment, the second dielectric layer 324c or 324d include dielectric material, such as silicon oxide ($SiO_2$), silicon nitride (SiN), or silicon oxynitride (SiON). In yet another alternative embodiment, the second dielectric layer 324c or 324d also includes a low-k dielectric material, such as fluorine-doped silicon oxide, carbon-doped silicon oxide, porous silicon oxide, porous carbon-doped silicon oxide, organic polymers, or silicone based polymers.

Referring now to FIG. 11A, a cross sectional view of the conducting feature 318 fabricated by using the method 200 is illustrated according to one or more embodiments. As shown in FIG. 11A, the conducting feature, designated with the reference number 318a, is a trapezoid structure. The trapezoid structure includes a bottom width ya and a top width xa. In the present embodiments, the bottom of the trapezoid structure is closer to a substrate, on which the trapezoid structure is formed, than the top of the trapezoid structure. In this embodiment, the bottom width ya is larger than the top width xa on the trapezoid structure.

The device 300 may include additional conducting features. As shown in FIG. 11B, the conducting feature, designated with the reference number 318b, is a parallelogram. The parallelogram structure includes a bottom width yb and a top width xb. In this embodiment, the bottom width yb is about the same as the top width xb on the parallelogram structure. As shown in FIG. 11C, the conducting feature, designated with the reference number 318c, is a trapezoid structure. The trapezoid structure includes a bottom width yc and a top width xc. In this embodiment, the bottom width yc is less than the top width xc on the parallelogram structure.

Figure 12:
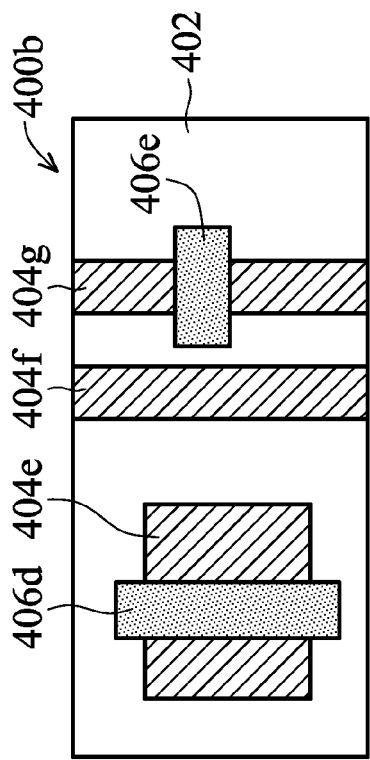
FIGS. 12-14 are examples of structures benefitting from one or more embodiments.
Figure 13:
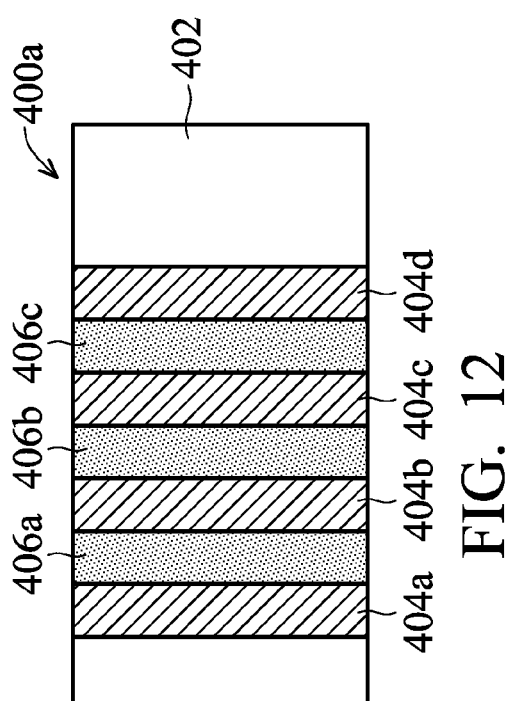
Figure 14:
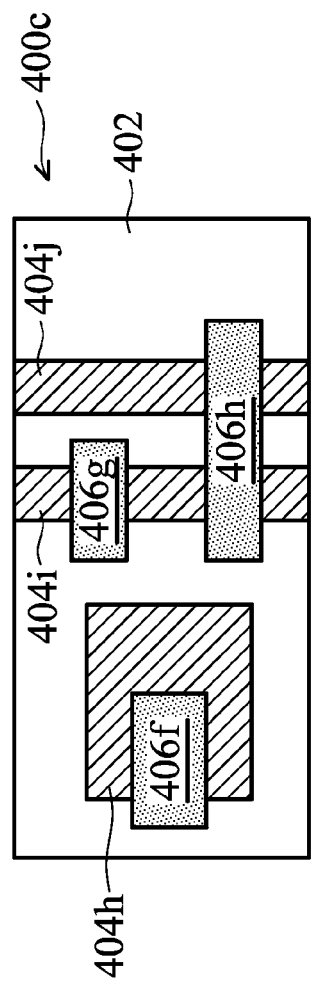

FIGS. 12-14 are examples of structures 400 fabricated by using the method 200 according to one or more embodiments. The structures 400 includes a substrate 402, conducting features 404a-j embedded into the substrate 402, and air gap structures 406a-h separating the conducting features 404a-j respectively. It is understood that other configurations and inclusion or omission of various items in the device 400 may be possible. The device 400 is example embodiment, and is not intended to limit the present invention beyond what is explicitly recited in the claims.

In some embodiments, the substrate 402 includes a dielectric material, such as silicon oxide ($SiO_2$), silicon nitride (SiN), or silicon oxynitride (SiON). In other embodiments, the substrate 402 includes a low-k dielectric material, such as fluorine-doped silicon oxide, carbon-doped silicon oxide, porous silicon oxide, porous carbon-doped silicon oxide, organic polymers, or silicone based polymers. In some embodiments, the conducting features 404a-j includes a metal or metal alloy, such as W, alloy, Al, Al alloy, Cu, or Cu alloy. In one or more embodiments, the air gap structures 406a-h may be filled by a dielectric material, such as silicon oxide ($SiO_2$), silicon nitride (SiN), or silicon oxynitride (SiNO), or low-k dielectric material, such as fluorine-doped silicon oxide, carbon-doped silicon oxide, porous silicon oxide, porous carbon-doped silicon oxide, organic polymers, or silicone based polymers.

As shown in FIG. 12, the structure 400a includes the substrate 402, the conducting features 404a-d embedded in the substrate 402, and the air gap structures 406a-c isolating each of the conducting features 404a-d respectively. The conducting features 404a-d are formed by forming a trench in the substrate 402, filling the trench with a conducting material, and performing an etching process. In one embodiment, the conducting features 404a-d may include a Cu line having a pitch as low as approximate 10 nm without Cu line collapse or fall down issue.

As shown in FIG. 13, the structure 400b includes the substrate 402, the conducting feature 404e-g and air gap structures 406d and 406e. The conducting features 404e-g are embedded in the substrate 402, and the air gap structures 406d divides the conducting feature 404e, and the air gap structures 406e divides the conducting feature 404g.

As shown in FIG. 14, the structure 400c includes the substrate 402, the conducting features 404h-j, and the air gap structures 406 f-g. The conducting features 404h-j are formed in the substrate 402, the air gap structure 406f cuts into the conducting feature 404h, the air gap structure 406g breaks the conducting feature 404i, and the air gap structure 406h breaks both conducting features 404i and 404j. In some embodiments, the air gap structures 406a-h may further be filled by a dielectric material.

Figure 15A:
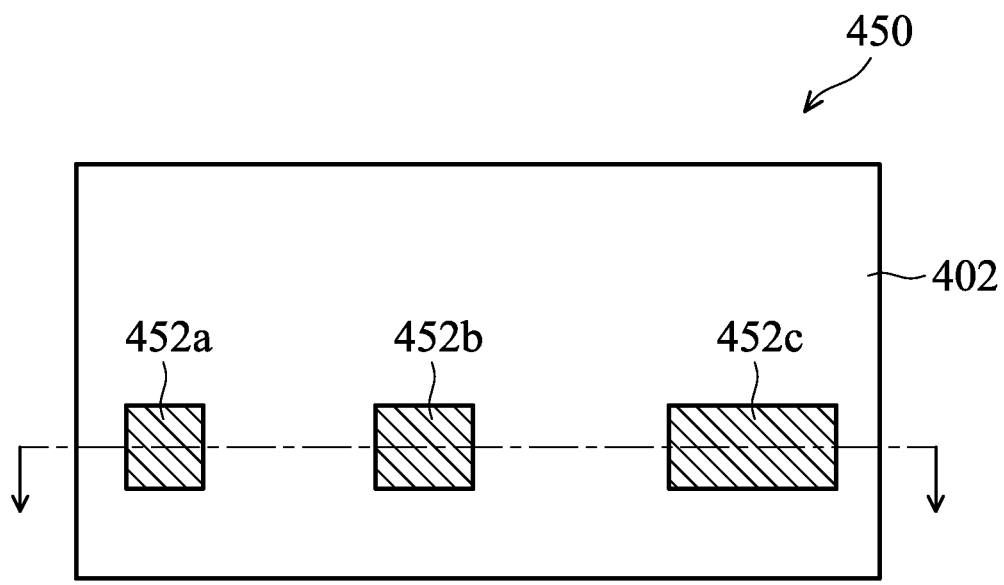
FIGS. 15A and 15B are top and cross sectional views of a metal island benefitting from one or more embodiments.
Figure 15B:
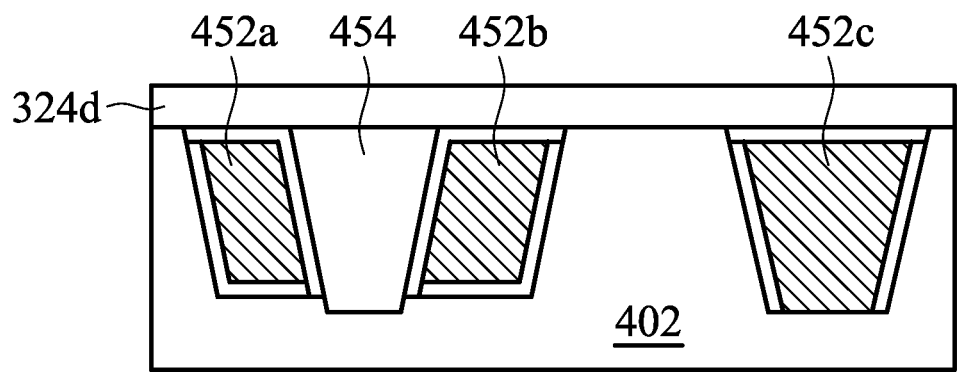

Referring now to FIGS. 15A and 15B, a top view and a cross sectional view of a device 450 are illustrated according to one or more embodiments. The device 450 includes the substrate 402 and conducting features 452a, 452b, and 452c. The conducting feature 452a-c are embedded into the substrate 402. In one embodiment, the conducting feature 452a includes a small dimension, such as 10 nm. Also, conducting features 452a and 452b have dimensions x and y (see FIGS. 11a-11c) such that x<y, x=y, or x>y. The conducting feature 452c has dimensions x and y such that x>y. Also in one embodiment, there is a gap structure 454 filed with air or dielectric material between conducting features 452a and 452b. In the present embodiments, a small conducting feature is also referred to as a small metal island. In one embodiment, the small metal island is formed by using the method 200 as shown in FIG. 2, such as forming a large metal feature, etching the large metal feature to form a small metal feature isolated by an air gap structure, and filling the air gap structure with a dielectric material to form a small metal island surrounded by the dielectric material.

Figure 16:
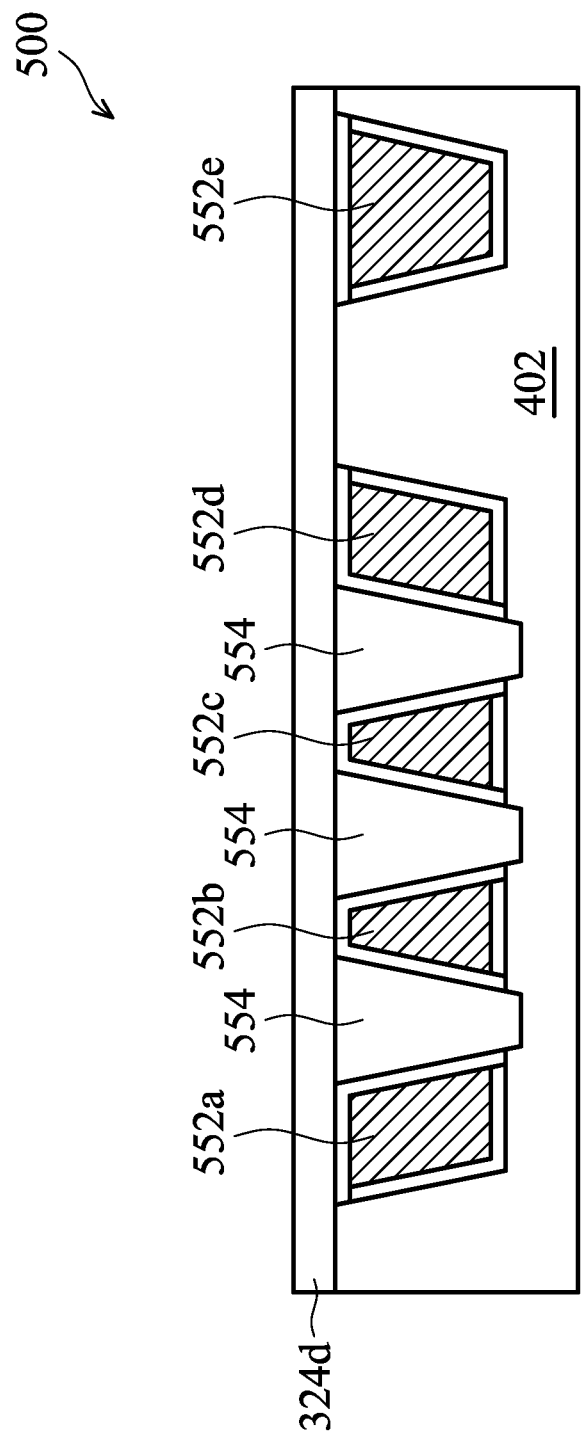
FIG. 16 is a cross section view of a metal island benefitting from one or more embodiments.

Referring now to FIG. 16, a device 500 includes the substrate 402 and conducting (e.g., Cu) features 552a, 552b, 552c, 552d, and 552e. The conducting feature 552a-e are embedded into the substrate 402. In one embodiment, one of the conducting features, e.g., 552c, has dimensions x and y (see FIGS. 11a-11c) such that x<y; one of the conducting features, e.g., 552d, has dimensions x and y such that x=y; and one of the conducting features, e.g., 552e, has dimensions x and y such that x>y. Also in one embodiment, there are gap structure 554 filed with air or dielectric material between conducting features 552a and b, between 552b and c, and between 552c and d.

In this embodiment, two trenches are formed using a damascene process. The conducting features 552a-552d are formed in the first trench, and the conducting feature 552e is formed in the second trench. Both trenches are filled with conducting material at the same time, similar to the trench 310 being filled with the conducting layer 314, as discussed above with reference to FIG. 6. The process continues in the first trench, similar to the process discussed above with reference to FIGS. 7-10C, and the conducting layer will be etched to form conducting feature 552a-d. The conducing layer will not be etched in the second trench, and will thereby form conducting feature 552e.

In the foregoing discussion, by fabricating a device, various processes, such as a film deposition process, a lithography process, an etching process, an ion implantation process, a CMP process, and a cleaning process, are performed. In the present embodiments, the film deposition process includes depositing a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

In some embodiments, the lithography process may include coating a resist film on a wafer substrate, exposing the resist film deposited on the wafer substrate by an optical lithography tool or an electron beam writer, and developing the exposed resist film to form a resist pattern for an ion implantation process or an etching process. The coating the resist film on the wafer substrate includes performing a dehydration process before applying the resist film on the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. The coating the resist film on the wafer substrate may include a soft bake (SB). The exposing the resist film deposited on the wafer substrate includes using an optical exposing tool or a charged particle exposing tool. The optical lithography tool may include an I-line, a deep ultraviolet (DUV), or an extreme ultraviolet (EUV) tool. The charged particle exposing tool includes an electron beam or an ion beam tool. The using the optical exposing tool includes using a mask. The mask may be a binary mask (BIM), a super binary mask (SBIM), or a phase shift mask (PSM), which includes an alternative phase shift mask (alt. PSM) or an attenuated phase shift mask (att. PSM). Developing the exposed resist film may include a post exposure bake (PEB), a post develop bake (PDB) process, or a combination thereof.

The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Thus, the present disclosure describes a device and a method. In one embodiment, the device includes a substrate and at least three conducting features embedded into the substrate. Each conducting feature includes a top width x and a bottom width y, such that a top and bottom width (x1, y1) of a first conducting feature has a dimension of (x1<y1, a top and bottom width (x2, y2) of a second conducting feature has a dimension of (x2<y2; x2=y2; or x2>y2), and a top and bottom width (x3, y3) of a third conducting feature has a dimension of (x3>y3). The device also includes a gap structure isolating the first and second conducting features. The gap structure can include such things as air or dielectric.

In another embodiment, the device includes a substrate, at least two conducting features embedded into the substrate, wherein the conducting feature includes a trapezoid shape having a bottom width larger than a top width, and an air gap structure isolating the two conducting features. The device further includes a first barrier layer separating the substrate and the conducting feature. The first barrier layer includes TaN/Ta. The device further includes a second barrier layer disposed over the two conducting features separated by the air gap structure. The second barrier layer may be extended over the substrate. The second barrier layer includes Co, SiC, SiN, SiCN or $SiO_2$. The device further includes a dielectric layer disposed over the air gap structure, wherein the air gap structure is buried under the dielectric layer without filling the air gap structure. The device further includes the air gap structure filled by the dielectric layer. The conducting feature includes Cu, Cu alloy, Al, Al alloy, W, or W alloy.

In another embodiment, the present disclosure describes a device including a substrate and at least three conducting features embedded into the substrate. Each conducting feature includes a top width x and a bottom width y. A top and bottom width (x1, y1) of the first conducting feature has a dimension of (x1<y1); a top and bottom width (x2, y2) of the second conducting feature has a dimension of (x2<y2; x2=y2; or x2>y2); and a top and bottom width (x3, y3) of the third conducting feature has a dimension of (x3>y3). The device further includes a gap structure isolating the first and second conducting features. The gap structure can be an air gap, a dielectric, or combinations thereof.

In another embodiment, the present disclosure describes a device including a substrate and three conducting features embedded into the substrate. The first conducting feature includes a top width x1 and a bottom width y1, such that (x1<y1; x1=y1; or x1>y1). The second conducting feature includes a top width x2 and a bottom width y2, such that (x2<y2; x2=y2; or x2>y2). The third conducting feature includes a top width x3 and a bottom width y3, such that (x3>y3). The device further includes a gap structure, such as air or dielectric, isolating the first and second conducting features.

The present disclosure also describes a method for fabricating a device. In one embodiment, the method includes receiving a substrate, forming a trench in the substrate, filling the trench with a conducing material, wherein filling the trench includes forming a first barrier layer on bottom and side wall of the trench and a conducting layer disposed over the first barrier layer, and performing an etching process on the conducting layer using a hard mask to form at least two conducting features isolated by an air gap structure. The method further includes depositing a second barrier layer over the two conducting features separated by the air gap structure. The method further includes extending the second barrier layer over the substrate. The method further includes depositing a dielectric layer over the second barrier layer disposed over the two conducting features separated by the air gap structure. Depositing the dielectric layer includes burying the air gap structure thereunder. Depositing the dielectric layer further includes filling the air gap structure.

In another embodiment, the method includes receiving a substrate, forming a trench in the substrate, filling the trench with a conducing material, wherein filling the trench includes forming a first barrier layer over side wall and bottom of the trench and forming a conducting layer over the first barrier layer, performing an etching process using a hard mask to form at least two conducting features separated by an air gap structure in the conducting layer, depositing a second barrier layer over the two conducting features, and depositing a dielectric layer over the second barrier layer.

The method further includes using a lithography process. Depositing the second barrier includes depositing the second barrier layer over the substrate. Depositing the dielectric layer include burying the air gap structure thereunder. Depositing the dielectric layer further includes filling the air gap structure.

In another embodiment, the method includes forming a first trench in a substrate and filling the first trench with a conducing material. Filling the first trench includes forming a first barrier layer on bottom and side walls of the first trench and a conducting layer disposed over the first barrier layer. The method further includes performing an etching process on the conducting layer using a hard mask to form first and second conducting features isolated by a gap structure. The first conducting features includes a top width that is less than a bottom width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, the method comprising:
receiving a substrate;
forming a first trench in the substrate;
forming a first barrier layer on bottom and side walls of the first trench;
forming a conducting material over the first barrier layer in the first trench;
performing an etching process on the conducting material using a hard mask to form first and second conducting features isolated by a gap structure, wherein the first conducting feature includes a top width that is less than a bottom width; and
forming a second barrier layer over a top surface of the first conductive feature and extending beyond the first barrier layer into the substrate such that the second barrier layer extends into the substrate at a greater depth than the first barrier layer.

2. The method of claim 1, wherein the second barrier layer includes a material selected from the group consisting of Co, SiC, SiN, SiCN and $SiO_2$.

3. The method of claim 1, further comprising depositing a dielectric layer over the second barrier layer.

4. The method of claim 3, wherein depositing the dielectric layer includes burying the gap structure thereunder.

5. The method of claim 1, further comprising filling the gap structure with a dielectric.

6. The method of claim 1, wherein the conducting material includes a material selected from the group consisting of Cu, Cu alloy, Al, Al alloy, W, and W alloy.

7. The method of claim 1, wherein the second conducting feature includes a top width and a bottom width, such that the top width is either substantially equal to or greater than the bottom width.

8. The method of claim 1, wherein the second barrier layer extends to the second conductive feature such that the second barrier layer is positioned between the gap structure and the substrate thereby preventing the gap structure from interfacing with the substrate.

9. A method comprising:
forming a first trench in a semiconductor substrate;
forming a first barrier layer in the first trench;
forming a conductive material in the first trench;
patterning the conductive material to form a first conductive feature and a second conductive feature isolated from each other by a gap structure, wherein the first barrier layer separates the semiconductor substrate and the first conductive feature after patterning the conductive material; and
forming a second barrier layer over a top surface of the first conductive feature and extending to the second conductive feature such that the second barrier layer is positioned between the gap structure and the semiconductor substrate thereby preventing the gap structure from interfacing with the semiconductor substrate.

10. The method of claim 9, further comprising forming a dielectric material layer over the gap structure, wherein at least a portion of the gap structure remains after forming the dielectric material layer over the gap structure.

11. The method of claim 9, further comprising forming a first dielectric material layer in the gap structure such that the first dielectric material layer physically contacts the second barrier layer.

12. The method of claim 11, wherein the first dielectric material layer completely fills the gap structure.

13. The method of claim 9, wherein forming the second barrier layer over the top surface of the first conductive feature and extending to the second conducting feature includes forming the second barrier layer over a top surface of the semiconductor substrate.

14. The method of claim 13, further comprising forming a dielectric material layer over the second barrier disposed over the top surface of the semiconductor substrate and over the gap structure, wherein at least a portion of the gap structure remains after forming the dielectric material layer over the gap structure.

15. The method of claim 9, wherein the first barrier layer is formed of a different material than the second barrier layer.

16. A method comprising:
forming a first trench in a semiconductor substrate;
forming a first barrier layer in the first trench;
forming a conductive material in the first trench;
patterning the conductive material to form a first conductive feature and a second conductive feature at least partially separated from each other by a gap structure, wherein the first barrier layer separates the semiconductor substrate and the first conductive feature after patterning the conductive material; and
forming a second barrier layer over a top surface of the first conductive feature and extending beyond the first barrier layer into the semiconductor substrate such that the second barrier layer extends into the semiconductor substrate at a greater depth than the first barrier layer.

17. The method of claim 16, wherein forming the second barrier layer over the top surface of the first conductive feature includes forming the second barrier layer along a surface of the semiconductor substrate and along a surface of the second conductive feature such that the second barrier layer extends continuously from the first conductive feature to the second conductive feature.

18. The method of claim 17, after forming the second barrier layer, forming a dielectric material in the gap structure.

19. The method of claim 18, wherein after forming the dielectric material in the gap structure, the second barrier layer prevents the dielectric material from interfacing with the semiconductor substrate.

20. The method of claim 18, wherein the first barrier layer includes a metal, and
wherein the second barrier layer includes silicon, and
wherein the first barrier layer is formed of a different material than the second barrier layer.

* * * * *